United States Patent
Sone

(10) Patent No.: US 6,632,738 B2
(45) Date of Patent: Oct. 14, 2003

(54) METHOD OF MANUFACTURING SEMICONDUCTOR DEVICE

(75) Inventor: Shuji Sone, Tokyo (JP)

(73) Assignee: NEC Electronics Corporation (JP)

(*) Notice: Subject to any disclaimer, the term of this patent is extended or adjusted under 35 U.S.C. 154(b) by 0 days.

(21) Appl. No.: 09/876,207

(22) Filed: Jun. 6, 2001

(65) Prior Publication Data

US 2001/0053592 A1 Dec. 20, 2001

(30) Foreign Application Priority Data

Jun. 7, 2000 (JP) ........................................ 2000-171095

(51) Int. Cl.[7] .............................................. H01L 21/44
(52) U.S. Cl. ....................... 438/659; 438/627; 438/643; 438/648; 438/681; 438/685
(58) Field of Search ................................. 438/627, 643, 438/648, 659, 685, 681

(56) References Cited

U.S. PATENT DOCUMENTS

| | | | |
|---|---|---|---|
| 5,258,329 A | * 11/1993 | Shibata | 438/620 |
| 5,455,198 A | * 10/1995 | Choi | 438/641 |
| 5,627,391 A | * 5/1997 | Shimada et al. | 257/295 |
| 5,659,201 A | * 8/1997 | Wolleson | 257/758 |
| 5,882,738 A | * 3/1999 | Blish et al. | 427/123 |
| 5,899,740 A | * 5/1999 | Kwon | 438/627 |
| 6,071,751 A | * 6/2000 | Wallace | 438/38 |
| 2001/0008226 A1 | * 7/2001 | Hung et al. | 216/18 |

FOREIGN PATENT DOCUMENTS

| | | | |
|---|---|---|---|
| JP | 2-241032 | * 9/1990 | |
| JP | 05-304148 | 11/1993 | ........ H01L/21/3205 |
| JP | 08-203900 | 8/1996 | ........ H01L/21/3205 |
| JP | 11-087499 | 3/1999 | .......... H01L/21/768 |
| JP | 11-288935 | 10/1999 | ........ H01L/21/3205 |
| JP | 2000-012686 | 1/2000 | .......... H01L/21/768 |

OTHER PUBLICATIONS

JP 05–304148 Machine Translation of Japanese Patent Application Publication, Nov. 16, 1993, [online], [retrieved on Jul. 11, 2000] Retrieved from the Patent Abstracts of Japan using internet <URL: http://www.jpo.go.jp/>, 4 pages.*

Kawasaki, Applied Physics, vol. 68, No. 11, Nov., 1999, p. 1226.

* cited by examiner

Primary Examiner—Stephen D. Meier
Assistant Examiner—Jeff Vockrodt
(74) Attorney, Agent, or Firm—Hayes Soloway P.C.

(57) ABSTRACT

An interlayer insulating film and a first via connected to a diffusion layer in a MOS transistor are formed on the diffusion layer. Then, a low dielectric constant film for a first layer copper interconnection, and the first layer copper interconnection connected to the first via are formed. Then, an etching stopper film, an interlayer insulating film, and a low dielectric constant film for a second layer copper interconnection are formed in this order. Then, a via hole is formed in the etching stopper film and the interlayer insulating film, and a groove is formed in the low dielectric constant film for the second layer copper interconnection. A barrier metal layer is then formed. Thereafter, Ar ions are implanted. At the time, the implantation energy is 50 keV, and the dose is $1 \times 10^{17}$ cm$^{-2}$. A second via and the second layer copper interconnection are formed, and annealing is performed at a temperature of 400° C.

15 Claims, 3 Drawing Sheets

METHOD OF MANUFACTURING SEMICONDUCTOR DEVICE

BACKGROUND OF THE INVENTION

1. Field of the Invention

The present invention at relates to methods of manufacturing semiconductor devices including the process of forming a multi-layer interconnection structure according to a damascene method. The invention more particularly relates to a method of manufacturing a semiconductor device having an improved electromigration resistance at the interface between a via and an interconnection and improved reliability for the multi-layer interconnection.

2. Description of the Related Art

A damascene method has been applied as a conventional method of forming a multi-layer interconnection in a semiconductor device. FIGS. 1A to 1C are sectional views showing steps in a method of manufacturing a semiconductor device according to such a conventional damascene method in the order of manufacture. As shown in FIG. 1A, an interlayer insulating film 30, for example, is formed on a diffusion layer 21 in a MOS transistor. A via 31 is formed in connection with the diffusion layer 21 in the interlayer insulating film 30. An interlayer insulating film 32 is formed on the interlayer insulating film 30 and the via 31. A first layer copper interconnection 22 is formed in connection with the via 31 in the interlayer insulating film 32. A barrier layer 23 of a silicon nitride (SiN) film is then formed. An interlayer insulating film 24 and an oxide layer 25 are placed on the barrier layer 23.

Then, as shown in FIG. 1B, a groove 27 for a second layer copper interconnection is formed in the oxide layer 25 by dry etching, and a via hole 26 is formed in the interlayer insulating film 24 and the barrier layer 23. Then, a barrier metal layer (not shown) of TiN, TaN or the like is formed by sputtering. Seed layer of Cu (not shown) is formed by sputtering.

Then, as shown in FIG. 1C, the via hole 26 and the groove 27 are plated with Cu to form a via 28 and a second layer copper interconnection 29 simultaneously. Then, the surface is planarized by CMD (Chemical Mechanical Polishing). The double layer interconnection structure is thus formed. The above-described process is repeated to form a desired multi-layer interconnection structure including three or more interconnection layers.

Japanese Patent Laid-Open Publication No. Hei. 5-304148 discloses a method of forming a multi-layer interconnection by a damascene method. According to the method, impurity ions are implanted into a lower interconnection layer followed by thermal treatment in vacuum. According to the disclosure, the impurity can be deposited on the surface of the lower interconnection layer to form a stabilized layer, so that a natural oxide film can be suppressed from being formed on the surface layer of the lower interconnection layer. As a result, the electric resistance at the contact portion can be lowered. Note that the ions are of an element of the same group as the element forming the lower interconnection layer or 7-group element ions.

Japanese Patent Laid-Open Publication No. Hei. 8-203900 discloses another method of forming a multi-layer interconnection by a damascene method. According to the disclosed method, the surface layer of an upper interconnection layer is turned amorphous, and then the amorphous layer is removed. According to the method, the surface of the upper interconnection layer is planarized, and a stabilized shape results. As a result, the reliability of the semiconductor device improves.

Furthermore, Japanese Patent Laid-open Publication Nos. 2000-12686, Hei. 11-87499 and Hei. 11-288935 also disclose methods of manufacturing a semiconductor device by a damascene method.

These conventional methods of manufacturing a semiconductor device by the damascene method however suffer from the following disadvantage. In a multi-layer interconnection formed by the damascene method, there are defects such as a micro void and an interface state at the interface between each interconnection and the via. Even having such a defect, the interface may be electrically connected right after it is formed. However, as described in Kawasaki, Applied Physics Vol. 68, 1999, P. 1226, a long term, high density current flow across the interface causes the electron flow momentum to be converted into the momentum of Cu atoms, which causes the Cu atoms to drift in the defect portion as a diffusion passage. As a result, disconnection results at the interface portion. In other words, electromigration is caused. The reliability of the semiconductor device having the multi-layer interconnection degrades as a result.

There has been no effective solution suggested for the disadvantage. According to the method disclosed by Japanese Patent Laid-Open Publication No. Hei. 5-304148, for example, an impurity layer is formed at the surface layer of a lower layer interconnection. In this case, electromigration is caused at the interfaces between the impurity layer and the metal forming the lower layer interconnection, and between the impurity layer and the via. According to the method disclosed by Japanese Patent Laid-Open Publication No. Hei. 8-203900, only the upper layer interconnection is turned amorphous, and the amorphous portion is removed by CMP. This method therefore does not contribute to a reduction in the defects at the interface between the lower layer interconnection and the via.

SUMMARY OF THE INVENTION

It is an object of the present invention to provide a method of manufacturing a semiconductor device allowing defects caused at the interface between each interconnection and a via in a multi-layer interconnection to be reduced in forming the multi-layer interconnection in the semiconductor device, so that electromigration at the interface may be reduced, and the reliability of the semiconductor device may be improved.

By the method of manufacturing a semiconductor device according to the present invention, a multi-layer interconnection structure is formed by a damascene method. The method comprises the steps of forming a first conductive layer, implanting ions into the first conductive layer, thereby turning at least a surface layer of the first conductive layer amorphous and forming a second conductive layer in connection with the surface layer of the first conductive layer.

According to the present invention, ions are implanted into the first conductive layer, so that at least a surface layer of the first conductive layer may be turned amorphous, and the reactivity at the interface between the first and second conductive layers may be improved. Thus, defects such as a micro void and an interface state may be reduced at the interface between the first and second conductive layers. As a result, the electromigration resistance at the interface improves, and the reliability of the semiconductor device improves. Herein, the conductive layer typically refers to an interconnection or a via in the semiconductor device.

By another method of manufacturing a semiconductor device according to the invention, a multi-layer interconnection structure is formed by a damascene method. According to the manufacturing method, a first interconnection layer including a first interconnection is formed, an interlayer insulating film is formed on the first interconnection layer, and a low dielectric constant film is formed on the interlayer insulating film. Then, a groove for an interconnection is formed in the low dielectric constant film, and a via hole is formed between the first interconnection and the groove in the interlayer insulating film. Ions are implanted into the bottom of the via hole to turn at least a surface layer of the first interconnection amorphous, and the via hole is filled with a conductive material to form a via. The groove is filled with a conductive material to form a second interconnection layer including a second interconnection connected with the via.

According to the present invention, the first interconnection is implanted with ions, so that at least a surface layer of the first interconnection is turned amorphous, and the reactivity between the first interconnection and the via is improved. Thus, when a conductive material to form the via is filled within the via hole, defects such as a micro void and an interface state are reduced at the interface between the first interconnection and the via. As a result, the electromigration resistance at the interface improves, and the reliability of the semiconductor device improves.

By another method of manufacturing a semiconductor device according to the present invention, a multi-layer interconnection structure is formed by a damascene method. According to the manufacturing method, a first interconnection layer including a first interconnection is formed, an interlayer insulating film is formed on the first interconnection layer, and a via hole is formed at a position in alignment with the first interconnection. Ions are then implanted into the bottom of the via hole to turn at least a surface layer of the first interconnection amorphous, and the via hole is filled with a conductive material to form a via. A second interconnection layer including a second interconnection in connection with the via is formed on the interlayer insulating film.

A barrier metal layer may he preferably ford on the via hole and the interlayer insulating film after the via hole is formed. The barrier metal layer formed on the via hole and the interlayer insulating film can prevent the material forming the second interconnection from being diffused in the interlayer insulating film. And, the barrier metal layer can improve the adhesion between the second interconnection and the interlayer insulating film.

The barrier metal may be preferably formed before the first interconnection is turned amorphous by the ion implantation. Thus, the interlayer insulating film can be prevented from being mechanically or chemically damaged by implanted ions. And by the barrier metal, the ions can be prevented from being implanted too deeply into the first interconnection, and only a surface layer in contact with the via may effectively be turned amorphous in the first connection.

The ions used for the ion implantation may be preferably ions of at least one element selected from the group consisting of H, N, C, Ar, Ne, Xe, and Kr. The ions are implanted into the first interconnection, so that the first interconnection can be turned amorphous without affecting the characteristics of the first interconnection.

Annealing may be preferably performed after the second conductive layer or the second interconnection layer is formed. Thus, defects caused by the ion implantation can be restored, and the interface state density at the interface between the first and second conductive layers and at the interface between the first interconnection layer and the via can be reduced. As a result, the reliability of the semiconductor device improves.

DETAILED DESCRIPTION OF THE PREFERRED EMBODIMENTS

Embodiments of the present invention will be described in detail in conjunction with the accompanying drawings. A first embodiment of the invention will be now described. While the present invention may be applied to both dual damascene and single damascene methods, the dual damascene method will be described in the embodiment. According to the embodiment, in forming a multi-layer interconnection, an interlayer insulating film and a low dielectric constant film on a first interconnection layer are provided with a via hole and a groove for a second interconnection layer and then implanted with ions. Annealing is performed after the second interconnection layer is formed.

Figure 1A:
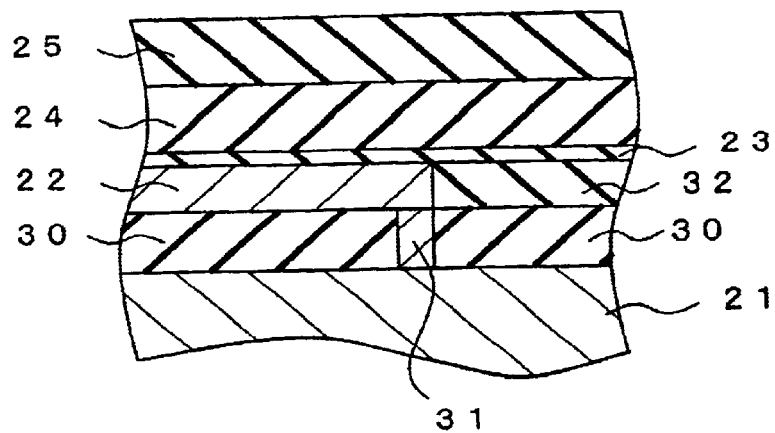
FIGS. 1A to 1C are sectional views showing steps in a conventional method of manufacturing a semiconductor device by a damascene method in the order of manufacture.
Figure 1B:
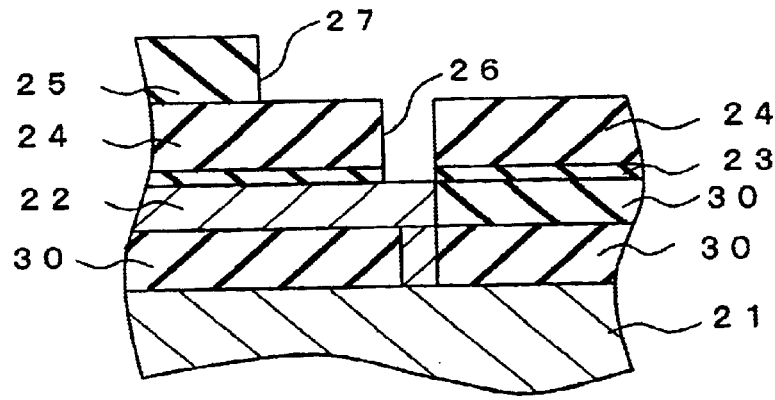
Figure 1C:
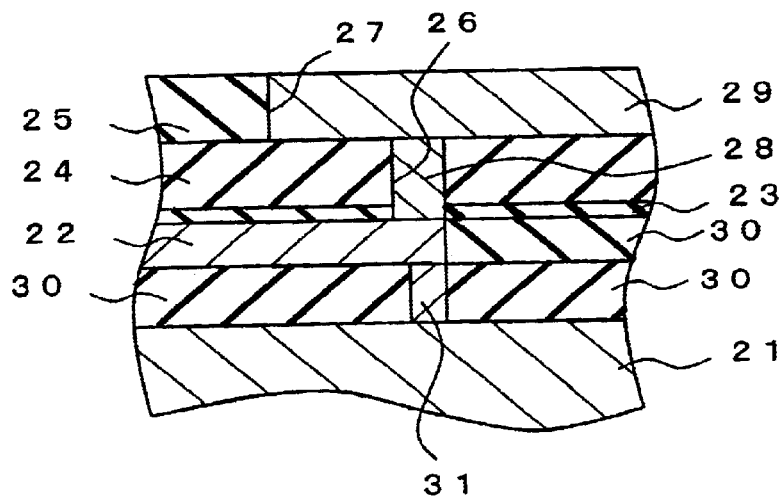
Figure 2A:
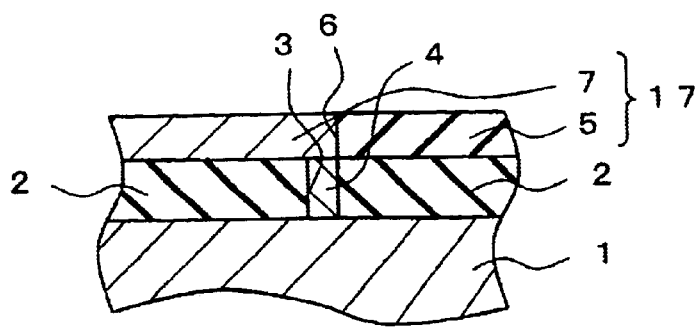
FIGS. 2A to 2E are sectional views showing steps in a method of manufacturing a semiconductor device according to a first embodiment of the present invention in the order of manufacture.

FIGS. 2A to 2E are sectional views showing steps in a method of manufacturing a semiconductor device according to the embodiment in the order of manufacture. As shown in FIG. 2A, an interlayer insulating film 2 of $SiO_2$ is formed on a diffusion layer 1 in a MOS transistor. The interlayer insulating film 2 is patterned by photolithography. The interlayer insulating film 2 is provided with a through hole 3 extending to the diffusion layer 1 in the MOS transistor by dry etching. TiN is deposited by sputtering to form a barrier metal layer (not shown). W is deposited in the through hole 3 by CVD (Chemical Vapor Deposition) to form a via 4. Thereafter, the surface is planarized by CMP, and coated with HSQ (Hydrogen silsesquioxane) in a thickness of 300 nm, for example, to form a low dielectric constant film 5 for a first layer copper interconnection. The low dielectric constant film 5 for the first layer copper interconnection is then patterned by photolithography. Then, a groove 6 for the first layer copper interconnection as wide as 200 nm, for example, is formed in the low dielectric constant film 5. TaN is then deposited to have a thickness of 40 nm, for example, by sputtering and a barrier metal layer is formed (not shown). Cu is then deposited by sputtering to have a thickness of 100 nm, for example, to obtain Cu seed (not shown). Cu is deposited to have a thickness of 600 nm, for example, by electrolytic plating and planarized by CMP to form a first layer copper interconnection 7. Thus, the interconnection structure as shown in FIG. 2A results. The low dielectric constant film 5 and the first layer copper interconnection 7 form a first interconnection layer 17.

Figure 2B:
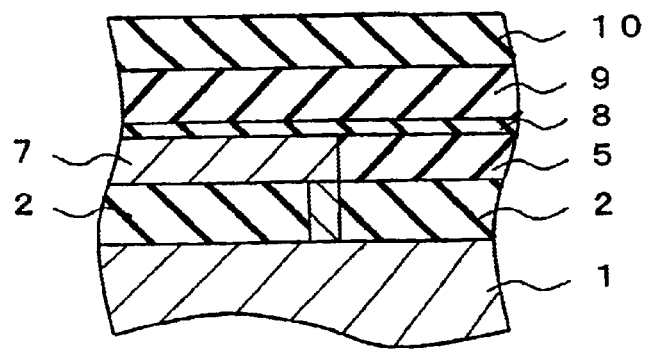

As shown in FIG. 2B, SiN is deposited to have a thickness of 70 nm, for example, by plasma CVD and an etching stopper layer 8 is thus formed. $SiO_2$ is then deposited to have a thickness of 700 nm and an interlayer insulating film 9 is thus formed. Then, a low dielectric constant film 10 of HSQ for the second layer interconnection is formed by coating.

Figure 2C:
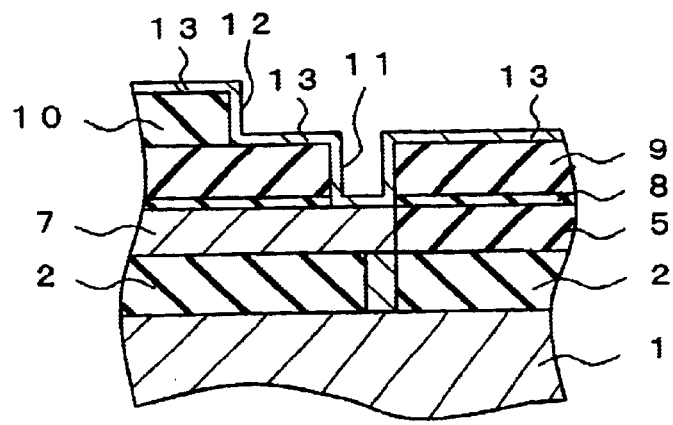

As shown in FIG. 2C, patterning for via etching is performed by photolithography. A via hole 11 having a diameter of 250 nm, for example, is formed in the interlayer insulating film 9 by dry etching. A resist (not shown) is formed. Patterning the resist for etching a groove for the second layer interconnection is performed by photolithography, and a groove 12 for the second layer interconnection as wide as 200 nm, for example, is formed by dry etching in the low dielectric constant film 10 for the second layer interconnection. TaN is then deposited to have a thickness of 40 nm by sputtering and a barrier metal layer 13 is thus formed.

Figure 2D:
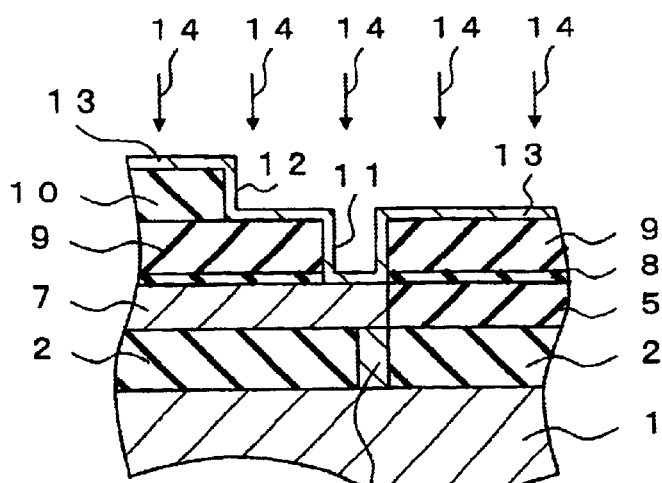

As shown in FIG. 2D, ions 14 are implanted. Thus, the surface layer of the first layer copper interconnection 7 provided at the bottom of the via hole 11 is turned into amorphous. The ions 14 used are ions of at least one element selected from the group consisting of H, N, C, Ar, Ne, Xe, and Kr. This is for the purpose of preventing property degradation of the copper interconnection in the process of turning it into amorphous. According to the embodiment, the ion species is Ar, the implantation energy is 50 keV, for example, and the dose is $1 \times 10^{17}$ cm$^{-2}$.

Figure 2E:
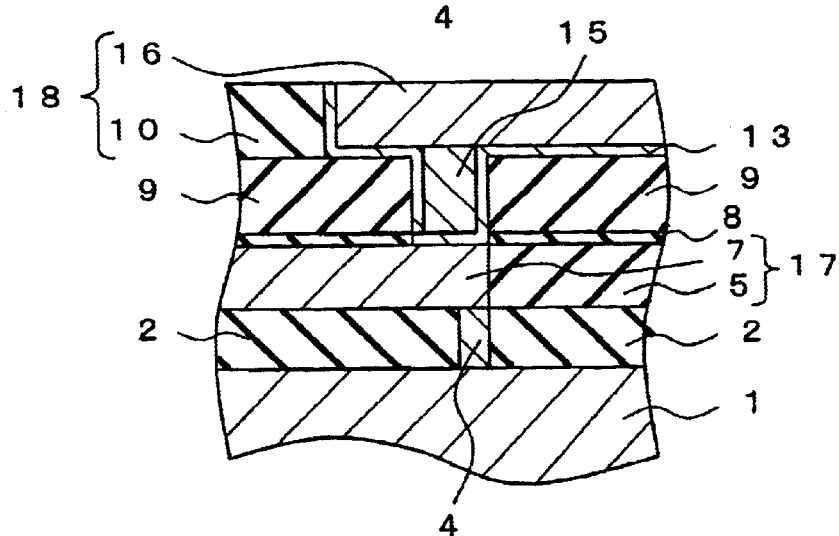

Seed Cu (not shown) is provided in a thickness of 100 nm by sputtering. Then, as shown in FIG. 2E, Cu is deposited by electrolytic plating, and a via 15 and a second layer copper interconnection 16 are formed. Planarization is then performed by CMP.

Thereafter, annealing is performed. The annealing temperature is preferably not less than 200° C. in order to restore defects caused by ion implantation and reduce the interface state density. The temperature is preferably not more than 600° C. to avoid effects upon the MOS transistor. However, annealing by RTA (Rapid Thermal Annealing) is performed in a different condition. The annealing temperature by RTA is preferably not less than 400° C. for restoring defects caused by ion implantation and in view of restrictions related to the device. Meanwhile, the annealing temperature by RTA is preferably not more than 1000° C. to avoid effects upon the MOS transistor. According to the embodiment, annealing in furnace is performed at a temperature of 400° C. rather that RTA.

Thus, a semiconductor device having the two-layer interconnection structure as shown in FIG. 2E may be manufactured. The structure of the semiconductor device produced by the method according to the embodiment will be now described. As shown in FIG. 2E, the via 4 connected with the diffusion layer 1 and the interlayer insulating film 2 filling the periphery of the via 4 are provided on the diffusion layer 1 in the MOS transistor. The first layer copper interconnection 7 connected with the via 4 and the low dielectric constant film 5 for the first layer copper interconnection are formed on the interlayer insulating film 2 and the via 4. The first layer copper interconnection 7 and the low dielectric constant film 5 for the first layer copper interconnection form the first interconnection layer 17. The etching stopper film 8 is formed on the first interconnection layer 17. The via 15 connected with the first layer copper interconnection 7 and the interlayer insulating film 9 filling the periphery of the via 15 are provided on the etching stopper film 8. The second layer copper interconnection 16 connected with the via 15 and the low dielectric constant film 10 for the second layer copper interconnection filling the periphery of the second layer copper interconnection 16 are provided on the interlayer insulating film 9 and the via 15. The second layer copper interconnection 16 and the low dielectric constant film 10 for the second layer copper interconnection form the second interconnection layer 18. There is the barrier metal layer 13 provided between the via 15 and the second layer copper interconnection 16 and the first layer copper interconnection 7, the interlayer insulating film 9 and the low dielectric constant film 10 for the second layer copper interconnection.

Note that the method of manufacturing a semiconductor device according to the embodiment may be repeated, so that a semiconductor device having a desired interconnection layer having three or more interconnection layers may be formed.

The effect of the embodiment will be now described. By the manufacturing method according to the embodiment the via hole 11 and the groove 12 for the second layer copper interconnection are formed and then ion implantation is performed, so that the surface layer of the first layer copper interconnection 7 provided at the bottom of the via hole 11 is turned into amorphous. Thus, the reactivity of Cu forming the surface layer portion improves. As a result, at the time of forming the via 15, a clean interface with less defects such as a micro void and an interface state can be formed at the interface between the first layer copper interconnection 7 and the via 15. Therefore, a long term, high density current flow across the interface between the first layer copper interconnection 7 and the via 15 is less likely to cause the Cu atoms to drift in the defects as a diffusion path and cause disconnection. More specifically, the electromigration resistance of the semiconductor device improves. Therefore, the reliability of the semiconductor device significantly improves.

The furnace annealing at a temperature of about 400° C. after forming the second layer copper interconnection 16 permits damages given by ion implantation to be significantly restored. The annealing also effectively reduces the interface state density at the interface between the first layer copper interconnection 7 and the via 4. As a result, the reliability of the semiconductor device improves.

Also according to the embodiment, the barrier metal layer 13 is formed on the via hole 11, the groove 12 and the interlayer insulating film 9 after the via hole 11 and the groove 12 for the second layer copper interconnection are formed and before ion implantation. Thus, the Cu atoms forming the second layer copper interconnection 16 can be prevented from being diffused in the interlayer insulating film 9. The second layer copper interconnection 16 and the interlayer insulating film 9 can be more closely contacted. The interlayer insulating film 9 can be prevented from being mechanically and chemically damaged by the implanted ions. As a result, the reliability of the semiconductor device can be improved. The barrier metal layer 13 prevents the ions 14 from being implanted too deeply in the first layer copper interconnection 7. As a result, only the surface layer in contact with the via 15 may effectively turned into amorphous in the first layer copper interconnection 7.

Figure 3:
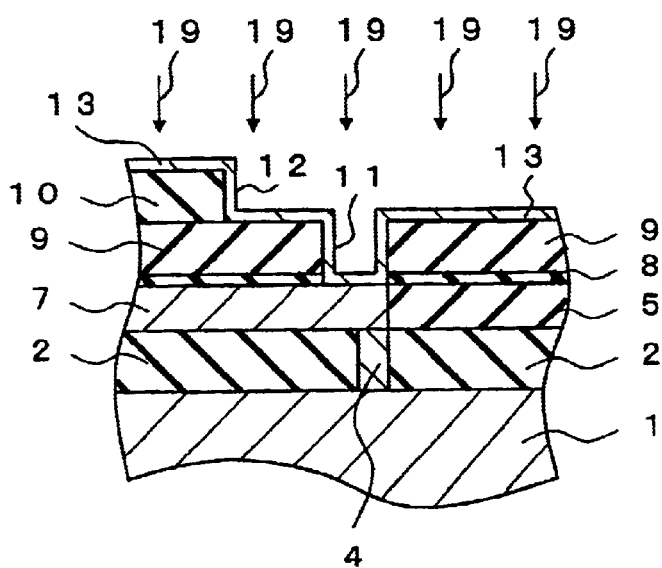
FIG. 3 is a sectional view for use in illustration of a method of manufacturing a semiconductor device according to a second embodiment of the present invention.

A second embodiment of the present invention will be now described. FIG. 3 is a sectional view for use in illustration of a method of manufacturing a semiconductor device according to the second embodiment of the present invention. In the method according to the embodiment, the structure of the manufactured semiconductor device and the method of depositing each layer are the same as those according to the first embodiment. According to the second embodiment, Kr is used as an ion species for ion implantation, and rapid thermal annealing (RTA) is performed.

Referring to FIGS. 2A to 2C and 2E and FIG. 3, the method of manufacturing the semiconductor device according to the embodiment will be described. As shown in FIG. 2A, an interlayer insulating film 2 of $SiO_2$ is formed on the diffusion layer 1 in the MOS transistor. The interlayer insulating film 2 is patterned by photolithography. A through hole 3 extending to the diffusion layer 1 in the MOS transistor is formed in the interlayer insulating film 2 by dry etching. TiN is then deposited by sputtering to form a barrier metal layer (not shown). W is then deposited in the through hole 3 by CVD to form a via 4. Thereafter, the surface is planarized by CMP. Then, HSQ is coated in a thickness of 300 nm, for example, and the low dielectric constant film 5 for the first layer copper interconnection is formed. The low dielectric constant film 5 is patterned by photolithography to form a groove 6 for the first layer copper interconnection as wide as 200 nm, for example, in the low dielectric constant film 5 by dry etching. Then, TaN is deposited by sputtering in a thickness of 40 nm, for example, to form a barrier metal layer (not shown) is formed. Cu is deposited by sputtering in a thickness of 100 nm, for example, to form Cu seed (not shown). The first layer copper interconnection 7 is formed to have a thickness of 600 nm, for example, by electrolytic plating. Planarization is then performed by CMP, and the interconnection structure as shown in FIG. 2A results.

As shown in FIG. 2B, SiN is deposited to have a thickness of 70 nm, for example, by plasma CVD, and an etching stopper layer 8 is formed. $SiO_2$ is then deposited to have a thickness of 700 nm, for example, to form an interlayer insulating film 9. Thereafter, a low dielectric constant film 10 of HSQ for the second layer interconnection is coated.

As shown in FIG. 2C, patterning for via etching is then performed by photolithography, and a via hole 11 having a diameter of 250 nm, for example, is formed in the interlayer insulating film 9. Patterning for etching a groove for the second layer interconnection by photolithography is performed, and a groove 12 for the second layer interconnection as wide as 200 nm, for example, is formed by dry etching in the low dielectric constant film 10 for the second layer interconnection. TaN is then deposited in a thickness of 40 nm, for example, by sputtering to form a barrier metal layer 13.

Then, as shown in FIG. 3, ions 19 are implanted. According to the embodiment, the ions 19 are Kr ions, the implantation energy is, for example, 50 keV, and the dose is, for example, $1 \times 10^{17}$ $cm^{-2}$.

Seed Cu (not shown) is deposited by sputtering to have a thickness of 100 nm. Then, as shown in FIG. 2E, the via 15 and the second layer copper interconnection 16 are formed by electrolytic plating. Then, planarization is performed by CMP.

After the second layer copper interconnection 16 is formed, annealing is performed. According to the embodiment, rapid thermal annealing is performed at a temperature of 800° C.

By the above method, a semiconductor device having a two-layer structure as shown in FIG. 2B may be manufactured. The manufacturing method may be repeated to form a desired multi-layer interconnection having three or more interconnection layers.

The embodiment provides the following effect. According to the manufacturing method of the embodiment, besides the effect of the first embodiment, the additionally performed, rapid thermal annealing allows the time required for the annealing to be reduced. Thus, the manufacturing efficiency of the semiconductor device may be improved.

According to the embodiment, Cu is used as a material for forming the interconnections, while a conductive material such as W and Al may be used. Also according to the embodiment, a barrier metal layer may be formed before ion implantation, while a barrier metal layer may be formed after the ion implantation depending upon the conditions of the ion implantation. In addition, depending upon the material used for interconnections, the barrier metal may be unnecessary.

What is claimed is:

1. A method of manufacturing a semiconductor device, wherein a multi-layer Interconnection structure is formed by a damascene method, comprising the steps in sequence of:

forming a first interconnection layer including a first interconnection;

forming an interlayer insulating film on said first interconnection layer;

forming a low dielectric constant film on said interlayer insulating film;

forming a groove for an interconnection in said low dielectric constant film;

forming a via hole between said first interconnection and said groove in said interlayer insulating film;

turning at least a surface layer of said first interconnection amorphous by implanting ions into the bottom of said via hole;

filling said via hole with a conductive material, thereby forming a via;

while said at least a surface layer of said first interconnection is still in an amorphous state, filling said groove with a conductive material, thereby forming a second interconnection layer including a second interconnection in connection with said via; and performing annealing after forming said second interconnection layer.

2. The method according to claim 1, further comprising the step of:

forming a barrier metal layer on said via hole, said groove and said low dielectric constant film after forming said groove and said via hole.

3. The method according to claim 1, further comprising the step of:

forming an etching stopper film on said first interconnection layer after forming said first interconnection layer and before forming an interlayer insulating film.

4. A method of manufacturing a semiconductor device, wherein a multi-layer interconnection structure is formed by a damascene method, comprising the steps of:

forming a first interconnection layer including a first interconnection;

forming an interlayer insulating film on said first interconnection layer;

forming a low dielectric constant film on said interlayer insulating film;

forming a groove for an interconnection in said low dielectric constant film;

forming a via hole between said first interconnection and said groove in said interlayer insulating film;

implanting ions into the bottom of said via hole, thereby turning at least a surface layer of said first interconnection amorphous;

filling said via hole with a conductive material, thereby forming a via; and filling said groove with a conductive material, thereby forming a second interconnection layer including a second interconnection in connection with said via; and further comprising the step of forming a barrier metal layer on said via hole, said groove and said low dielectric constant film after forming said groove and said via hole;

wherein said barrier metal layer is formed before said first interconnection is turned amorphous by said ion implantation.

5. A method of manufacturing a semiconductor device, wherein a multi-layer interconnection structure is formed by a damascene method, comprising the steps in sequence of:

forming a first interconnection layer including a first interconnection;

forming an interlayer insulating film on said first interconnection layer;

forming a via hole in alignment with said first interconnection in said interlayer insulating film;

turning at least a surface layer of said first interconnection amorphous by implanting ions into the bottom of said via hole;

filling said via hole with a conductive material, thereby forming a via;

while said at least a surface layer of said first interconnection is still in an amorphous state, forming a second interconnection layer including a second interconnection in connection with said via on said interlayer insulating film; and performing said second interconnection layer.

6. The method according to claim 5, further comprising the step of forming a barrier metal layer on said via hole and said interlayer insulating film after forming said via hole.

7. A method of manufacturing a semiconductor device, wherein a multi-layer interconnection structure is formed by a damascene method, comprising the steps in sequence of:

forming a first interconnection layer including a first interconnection;

forming an interlayer insulating film on said first interconnection layer;

forming a low dielectric constant film on said interlayer insulating film;

forming a groove for an interconnection in said low dielectric constant film;

forming a via hole between said first interconnection and said groove in said interlayer insulating film;

implanting ions into the bottom of said via hole, thereby turning at least a surface layer of said first interconnection amorphous;

filling said via hole with a conductive material, thereby forming a via; and filling said groove with a conductive material, thereby forming a second interconnection layer including a second interconnection in connection with said via; and further comprising the step of forming a barrier metal layer on said via hole and said interlayer insulating film after forming said via hole;

wherein said barrier metal layer is formed before said first interconnection is turned amorphous by said ion implantation.

8. A method of manufacturing a semiconductor device, wherein a multi-layer interconnection structure is formed by a damascene method, comprising the steps of:

forming a first interconnection layer including a first interconnection;

forming an interlayer insulating film on said first interconnection layer;

forming a low dielectric constant film on said interlayer insulating film;

forming a groove for an interconnection in said low dielectric constant film;

forming a via hole between said first interconnection and said groove in said interlayer insulating film;

forming a barrier metal layer on said via hole, said groove and said low dielectric constant film after forming said groove and said via hole;

turning at least a surface layer of said first interconnection amorphous by implanting ions into the bottom of said via hole;

filling said via hole with a conductive material, thereby forming a via;

while said at least a surface layer of said first interconnection is still in an amorphous state, filling said groove with a conductive material, thereby forming a second interconnection layer including a second interconnection in connection with said via; and performing annealing after forming said second interconnection layer.

9. The method according to claim 8, wherein said barrier metal layer is formed before said first interconnection is turned amorphous by said ion implantation.

10. The method according to claim 8, wherein the ions used for said ion implantation are ions of at least one element selected from the group consisting of H, N, C, Ar, Ne, Xe, and Kr.

11. The method according to claim 8, further comprising the step of:

forming an etching stopper film on said first interconnection layer after forming said first interconnection layer and before forming an interlayer insulating film.

12. A method of manufacturing a semiconductor device, wherein a multi-layer Interconnection structure is formed by a damascene method, comprising the steps of:

forming a first interconnection layer including a first interconnection;

forming an interlayer insulating film on said first interconnection layer;

forming an etching stopper film on said first interconnection layer on said first interconnection layer;

forming a low dielectric constant film on said etching stopper film;

forming a groove for an interconnection in said low dielectric constant film;

forming a via hole between said first interconnection and said groove in said interlayer insulating film;

turning at least a surface layer of said first interconnection amorphous by implanting ions into the bottom of said via hole;

filling said via hole with a conductive material, thereby forming a via;

while said at least a surface layer of said first interconnection is still in an amorphous state, filling said groove with a conductive material, thereby forming a second interconnection layer including a second interconnection in connection with said via; and performing annealing after forming said second interconnection layer.

13. The method according to claim 12, further comprising the step of:

forming a barrier metal layer on said via hole, said groove and said low dielectric constant film after forming said groove and said via hole.

14. The method according to claim 12, wherein the ions used for said ion implantation are ions of at least one element selected from the group consisting of H, N, C, Ar, Ne, Xe, and Kr.

15. A method of manufacturing a semiconductor device, wherein a multi-layer interconnection structure is formed by a damascene method, comprising the steps of:

forming a first interconnection layer including a first interconnection;

forming an interlayer insulating film on said first interconnection layer;

forming an etching stopper film on said first interconnection layer on said first interconnection layer;

forming a low dielectric constant film on said etching stopper film;

forming a groove for an interconnection in said low dielectric constant film;

forming a via hole between said first interconnection and said groove in said interlayer insulating film;

turning at least a surface layer of said first interconnection amorphous by implanting ions into the bottom of said via hole;

filling said via hole with a conductive material, thereby forming a via; and filling said groove with a conductive material, thereby forming a second interconnection layer including a second interconnection in connection with said via; and further comprising the step of forming a barrier metal layer on said via hole, said groove and said low dielectric constant film after forming said groove and said via hole;

wherein said barrier metal layer is formed before said first interconnection is turned amorphous by said ion implantation.

* * * * *